United States Patent
Yoon

(10) Patent No.: US 9,419,633 B1
(45) Date of Patent: Aug. 16, 2016

(54) INTERFACE CIRCUIT FOR HIGH SPEED COMMUNICATION, AND SEMICONDUCTOR APPARATUS AND SYSTEM INCLUDING THE SAME

(71) Applicant: SK hynix Inc., Icheon-si Gyeonggi-do (KR)

(72) Inventor: In Sik Yoon, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/724,158

(22) Filed: May 28, 2015

(30) Foreign Application Priority Data

Jan. 29, 2015 (KR) .................. 10-2015-0014443

(51) Int. Cl.
| | |
|---|---|
| *G11C 7/00* | (2006.01) |
| *G11C 8/00* | (2006.01) |
| *H03L 7/24* | (2006.01) |
| *G11C 8/18* | (2006.01) |
| *H03K 3/356* | (2006.01) |

(52) U.S. Cl.
CPC .. *H03L 7/24* (2013.01); *G11C 8/18* (2013.01); *H03K 3/356* (2013.01)

(58) Field of Classification Search
CPC .. G11C 7/1072; G11C 7/1078; G11C 7/1066; G11C 7/1084; G11C 7/109; G11C 7/1093; G11C 7/1051; G11C 7/1087; G11C 7/10; G11C 7/1057
See application file for complete search history.

(56) References Cited

U.S. PATENT DOCUMENTS

| | | | |
|---|---|---|---|
| 5,396,633 A | 3/1995 | Mayer et al. | |
| 6,084,934 A | 7/2000 | Garcia et al. | |
| 2006/0092721 A1* | 5/2006 | Lee ............ | G11C 7/1051 365/191 |
| 2007/0286012 A1* | 12/2007 | Lee ............ | G11C 7/1051 365/233.1 |
| 2012/0113728 A1* | 5/2012 | Kwon .......... | G11C 7/1006 365/189.05 |

* cited by examiner

*Primary Examiner* — Hien Nguyen
(74) *Attorney, Agent, or Firm* — William Park & Associates Ltd.

(57) ABSTRACT

An interface circuit of a semiconductor apparatus may include a pulse generation unit, a data clock synchronization unit and a system clock synchronization unit. The pulse generation unit may be configured to generate a burst end pulse from a burst end signal according to a data clock signal. The data clock synchronization unit may be configured to enable a data clock synchronization signal based on the burst end pulse and the data clock signal, and disable the data clock synchronization signal according to a burst end detection signal. The system clock synchronization unit may be configured to generate the burst end detection signal by synchronizing the data clock synchronization signal with a system clock signal.

20 Claims, 8 Drawing Sheets

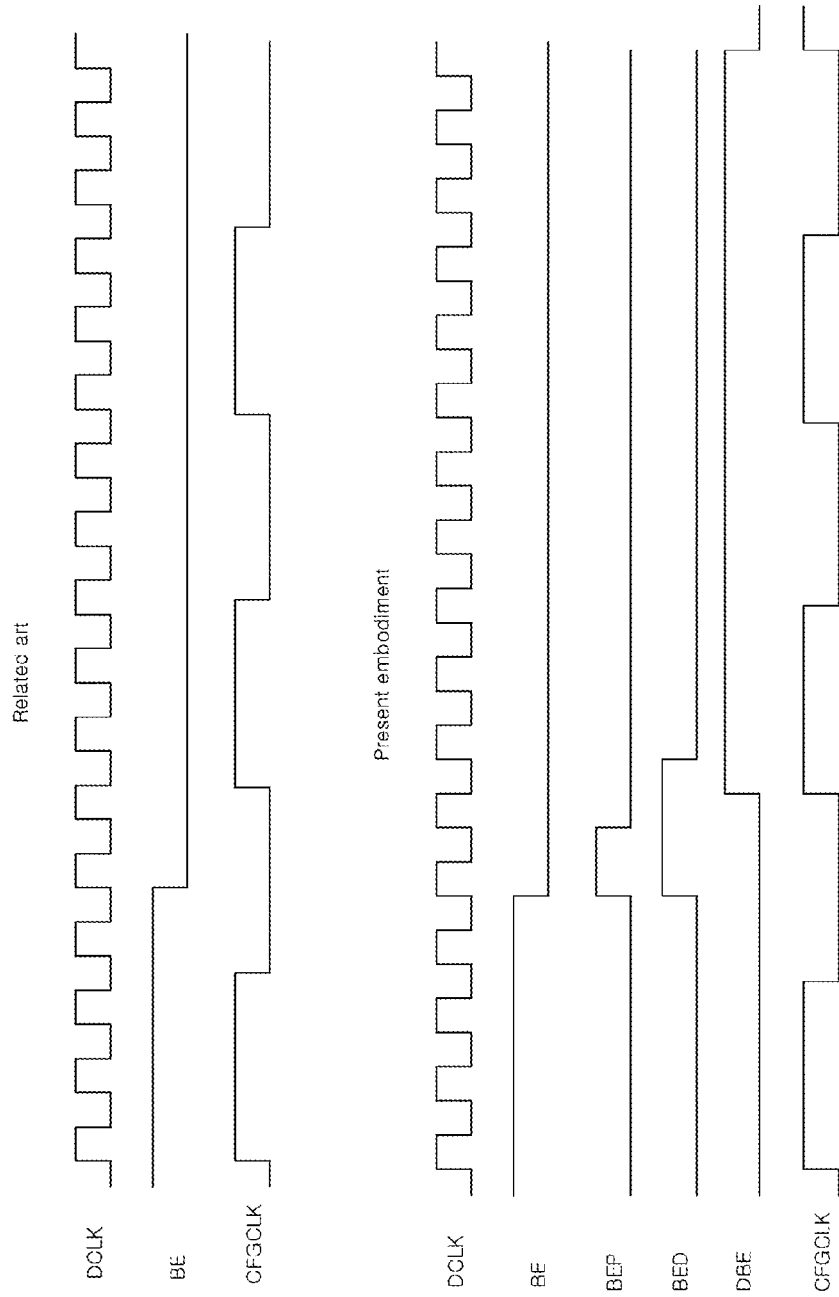

US 9,419,633 B1

INTERFACE CIRCUIT FOR HIGH SPEED COMMUNICATION, AND SEMICONDUCTOR APPARATUS AND SYSTEM INCLUDING THE SAME

CROSS-REFERENCES TO RELATED APPLICATION

The present application claims priority under 35 U.S.C. §119(a) to Korean application number 10-2015-0014443, filed on Jan. 29, 2015, in the Korean Intellectual Property Office, which is incorporated herein by reference in its entirety.

BACKGROUND

1. Technical Field

Various embodiments generally relate to a communication system, and more particularly, to an interface circuit for high speed communication, and a semiconductor apparatus and a system including the same.

2. Related Art

Electronic products for personal uses, such as a personal computer, a tablet PC, a laptop computer and a smart phone, may be constructed by various electronic components. Two different electronic components in the electronic products may communicate at a high speed to process a large amount of data within a short time. The electronic components may generally communicate through interface circuits. The electronic components may communicate in various schemes, and a serial communication scheme is one example.

As the performances of electronic components are improved, necessity for a communication scheme capable of increasing a bandwidth and reducing power consumption is being increased. In order to meet such necessity, new serial communication schemes are being suggested in various ways, and improved interface circuits to support the new serial communication schemes are being developed.

SUMMARY

In an embodiment, an interface circuit of a semiconductor apparatus may include a pulse generation unit configured to generate a burst end pulse from a burst end signal according to a data clock signal. The interface circuit may also include a data clock synchronization unit configured to enable a data clock synchronization signal based on the burst end pulse and the data clock signal, and disable the data clock synchronization signal according to a burst end detection signal. The interface circuit may also include a system clock synchronization unit configured to generate the burst end detection signal by synchronizing the data clock synchronization signal with a system clock signal.

In an embodiment, an interface circuit of a semiconductor apparatus may include a pulse generation unit configured to generate a burst end pulse according to a burst end signal and a data clock signal. The interface circuit may also include a data clock synchronization unit configured to enable a data clock synchronization signal until a burst end detection signal is enabled when the burst end pulse is generated. The interface circuit may also include a system clock synchronization unit configured to generate the burst end detection signal by synchronizing the data clock synchronization signal with a system clock signal.

In an embodiment, a system may a semiconductor apparatus electrically coupled with a host, and including a controller and at least one memory electrically coupled with the controller and stores and outputs data. The controller may include a pulse generation unit configured to generate a burst end pulse according to a burst end signal and a data clock signal. The controller may also include a data clock synchronization unit configured to enable a data clock synchronization signal until a burst end detection signal is enabled when the burst end pulse is generated. Further, the controller may include a system clock synchronization unit configured to generate the burst end detection signal by synchronizing the data clock synchronization signal with a system clock signal.

BRIEF DESCRIPTION OF THE DRAWINGS

FIG. 9 is a representation of an example of a waveform diagram to assist in the explanation of operations of interface circuits according to an embodiment.

DETAILED DESCRIPTION

Hereinafter, an interface circuit for high speed communication, and a semiconductor apparatus and a system including the same will be described below with reference to the accompanying figures through various embodiments.

Figure 1:
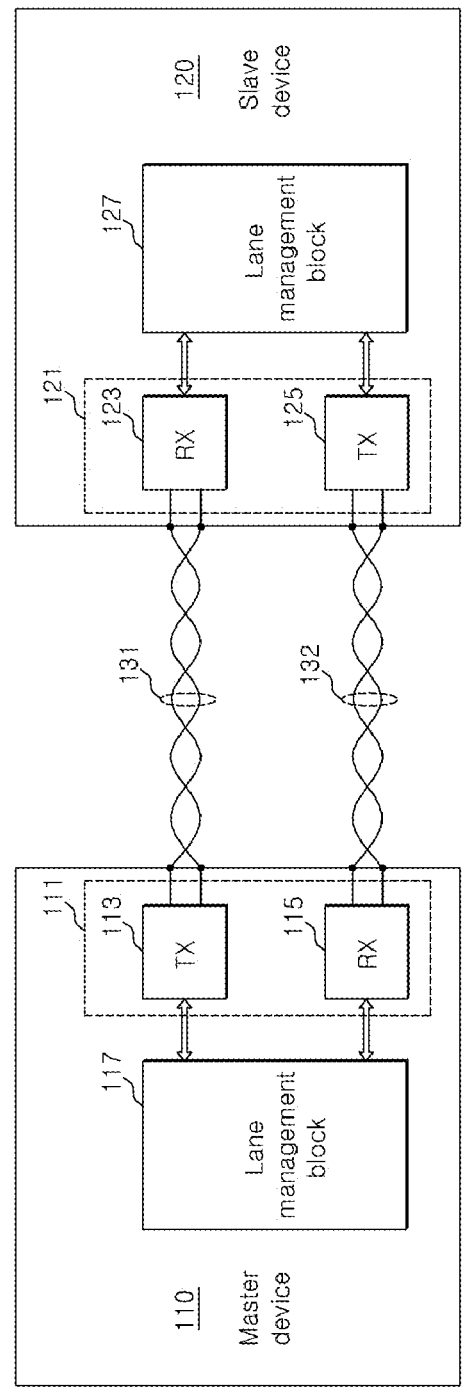
FIG. 1 is a diagram illustrating a representation of an example of the configuration of a system in accordance with an embodiment.

Embodiments may provide an interface circuit enabling quick operation mode conversion and a semiconductor apparatus including the same, in a system communicating at a high speed. In FIG. 1, a system 1 in accordance with an embodiment may include a master device 110 and a slave device 120. The master device 110 may be a host device which controls the slave device 120. The master device 110 may perform a calculation operation and generate various control signals for controlling the slave device 120. The slave device 120 may perform various operations by being controlled by the master device 110. The master device 110 and the slave device 120 may configure one link. The master device 110 and the slave device 120 may communicate through a sub link. In detail, the master device 110 and the slave device 120 may include interface circuits 111 and 121, respectively, to communicate at a high speed. The master device 110 and the slave device 120 may be electrically coupled through signal transmission lines 131 and 132 and exchange signals through the signal transmission lines 131 and 132 and the interface circuits 111 and 121.

The interface circuit 111 and 121 may perform serial communication of a differential signal transmission scheme. The interface circuit 111 of the master device 110 may include a transmitter (TX) 113 for transmitting a signal from the master device 110 to the slave device 120. The interface circuit 111 may also include a receiver (RX) 115 for receiving the signal transmitted from the slave device 120. The interface circuit 121 of the slave device 120 may include a receive (RX) 123 for receiving the signal transmitted from the master device 110. The interface circuit 121 may also include a transmitter (TX) 125 for transmitting a signal to the master device 110. The signal transmission paths 131 and 132 may include a plurality of lanes, and each lane may include two signal transmission lines. The two signal transmission lines may transmit a differential signal. While FIG. 1 illustrates an example in which one lane 131 electrically couples the transmitter 113 of the master device 110 and the receiver 123 of the slave device 120 and one lane 132 electrically couples the transmitter 125 of the slave device 120 and the receiver 115 of the master device 110, it is to be noted that the embodiment is not limited to such an example and the system 1 may further include a plurality of lanes for transmission and reception of signals.

The master device 110 and the slave device 120 may further include lane management blocks 117 and 127. The lane management blocks 117 and 127 may perform the functions of dividing signals to be transmitted and mixing received signals when the master device 110 and the slave device 120 exchange signals through the plurality of lanes.

Figure 2:
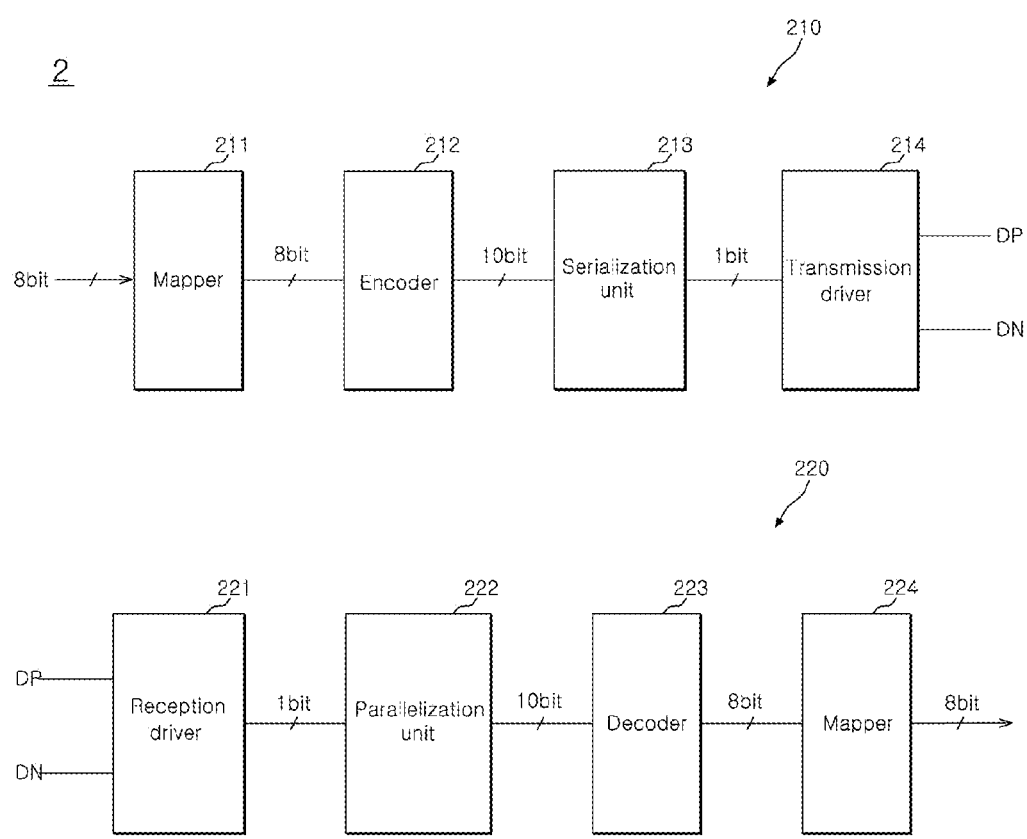
FIG. 2 is a diagram illustrating a representation of an example of the configuration of an interface circuit in accordance with an embodiment.

Referring to FIG. 2, a diagram illustrating a representation of an example of the configuration of an interface circuit 2 in accordance with an embodiment is illustrated. The interface circuit 2 may be applied to the interface circuits 111 and 121 of the master device 110 and the slave device 120 shown in FIG. 1. In FIG. 2, for example, components which may correspond to the transmitter 113 of the master device 110 and the receiver 123 of the slave device 120 are shown. The transmitter 113 may be referred to as an interface circuit 210 of a master device. Further, the receiver 123 may be referred to as an interface circuit 220 of a slave device. The interface circuit 210 of the master device and the interface circuit 220 of the slave device may communicate with each other through two signal transmission lines DP and DN. The two signal transmission lines DP and DN may transmit a differential signal.

The interface circuit 210 of the master device may include a mapper 211, an encoder 212, a serialization unit 213, and a transmission driver 214. The mapper 211 may reconfigure data by adding a control symbol such that the data may be suited to the interface protocol of the system. 8-bit data may be the form of data to be used in the master device and the slave device. The encoder 212 may generate a 10-bit symbol which has a predetermined pattern according to the information of the 8-bit data. For example, the encoder 212 may encode the 8-bit data such that the level of the signal transmitted through the signal transmission lines DP and DN may continuously transition. Since the serial communication scheme between the master device and the slave device does not use a clock signal, a clock signal should be internally generated based on the signal transmitted through the signal transmission lines DP and DN. To precisely generate the clock signal, the signal transmitted through the signal transmission lines DP and DN need to continuously transition.

The serialization unit 213 may serialize the 10-bit encoded symbol outputted from the encoder 212, and sequentially output 1 bit by 1 bit. The transmission driver 214 may output the 10-bit encoded symbol to the signal transmission lines DP and DN through 10 times in response to the outputs of the serialization unit 213. The transmission driver 214 may transmit a differential signal corresponding to 1 bit to the signal transmission lines DP and DN. Accordingly, the 10-bit symbol may be transmitted to the interface circuit 220 of the slave device through 10 times through the transmission driver 214 and the signal transmission lines DP and DN.

The interface circuit 220 of the slave device may include a reception driver 221, a parallelization unit 222, a decoder 223, and a mapper 224. The reception driver 221 may receive the signal transmitted through the signal transmission lines DP and DN from the interface circuit 210 of the master device. The reception driver 221 may differentially amplify the signal transmitted through the signal transmission lines DP and DN. The reception driver 221 may also output a 1-bit signal. The parallelization unit 222 my parallelize the output of the reception driver 221, and output a 10-bit symbol. The decoder 223 may decode the 10-bit symbol, and recover 8-bit data. The mapper 224 may recover the output of the decoder 223 as 8-bit data the same as the 8-bit data inputted to the mapper 211 according to the control symbol added by the mapper 211 of the interface circuit 210 of the master device. While not shown, the interface circuit 220 of the slave device may further include a clock data recovery circuit for generating an internal clock signal based on the signal transmitted through the signal transmission lines DP and DN. The interface circuit 220 may further include a deskewing circuit for correcting the distortion of the signal.

Among the components of the interface circuit 210 of the master device, the mapper 211 and the encoder 212 may be circuits of a digital operation region. Further, the serialization unit 213 and the transmission driver 214 may be circuits of an analog operation region. Among the components of the interface circuit 220 of the slave device, the reception driver 221 and the parallelization unit 222 may be circuits of an analog operation region. In addition, the decoder 223 and the mapper 224 may be circuits of a digital operation region.

Figure 3:
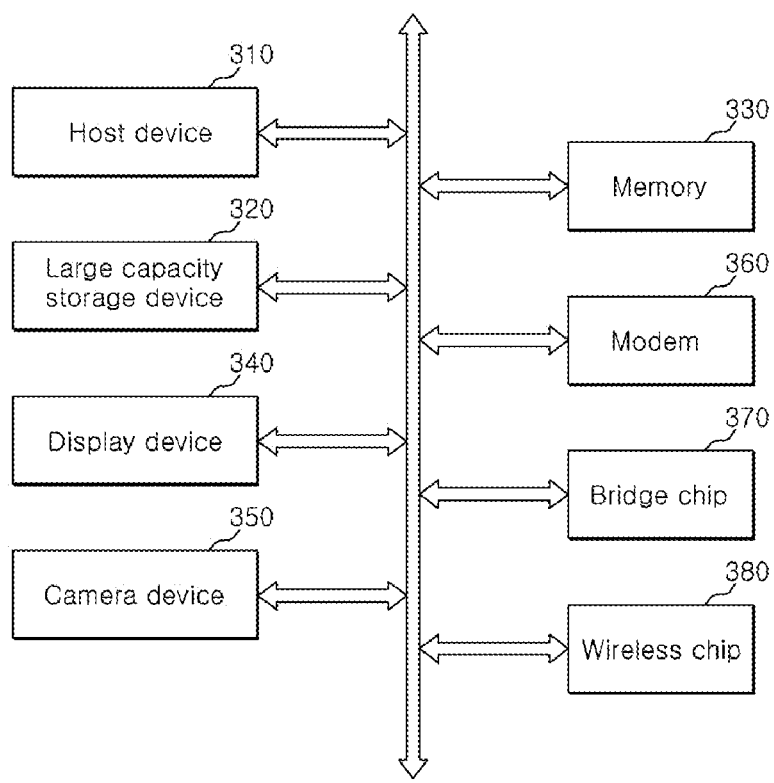
FIG. 3 is a diagram illustrating a representation of an example of a system including electronic components which use the serial communication scheme illustrated in FIGS. 1 and 2.

Referring to FIG. 3, a diagram illustrating a representation of an example of a system including electronic components which use the serial communication scheme illustrated in FIGS. 1 and 2 are described. In FIG. 3, the system 3 may include a host device 310, a large capacity storage device 320, a memory 330, a display device 340, a camera device 350, a modem 360, a bridge chip 370, and a wireless chip 380. The host device 310 may communicate with the remaining components by forming respective individual links.

The host device 310 may include at least one integrated circuit device such as an application processor and an application specific integrated circuit (ASIC). The large capacity storage device 320 may include at least one storage device such as a solid state drive (SSD) and a flash drive through USB coupling. The memory 330 may include any kind of memory device. For example, the memory 330 may include a volatile memory device such as a DRAM (dynamic RAM). In the alternative, the memory 330 may also include a nonvolatile memory device such as a ROM (read only memory), a PROM (programmable ROM), an EEPROM (electrically erasable and programmable ROM), an EPROM (electrically programmable ROM), a FLASH memory, a PRAM (phase change RAM), an MRAM (magnetic RAM), an RRAM (resistive RAM) and an FRAM (ferroelectric RAM).

The host device 310 may communicate with the large capacity storage device 320 and the memory 330 by forming respective links. The host device 310, the large capacity storage device 320 and the memory 330 may each include the interface circuit shown in FIGS. 1 and 2, and may exchange signals with one another in a serial communication scheme. Similarly, the host device 310 may communicate serially with the display device 340, the camera device 350, the modem 360, the bridge chip 370 and the wireless chip 380 by forming individual links.

Figure 4:
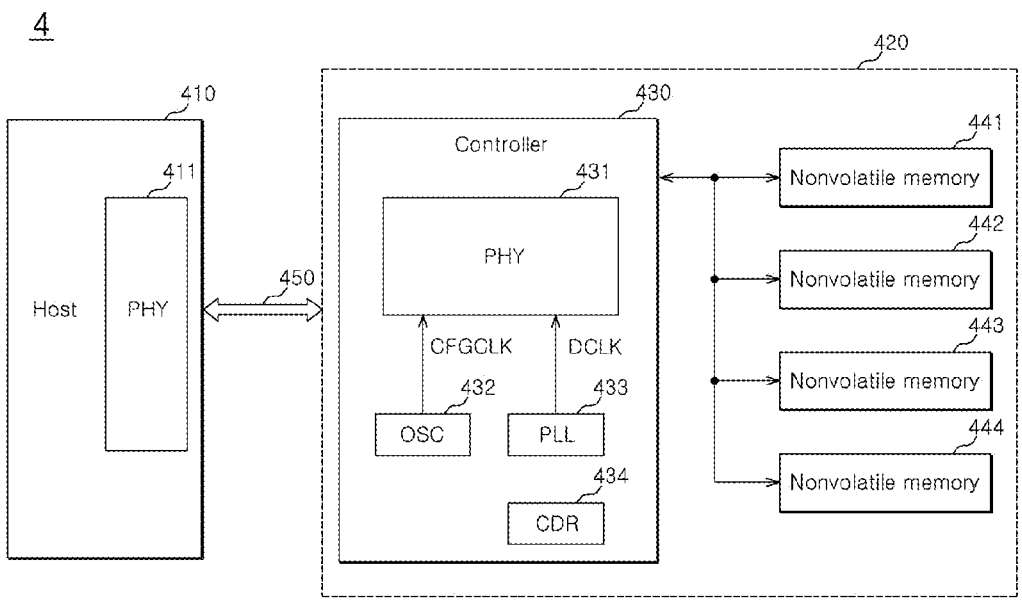
FIG. 4 is a diagram illustrating a representation of an example of the configuration of a system in accordance with an embodiment.

Referring to FIG. 4, a diagram illustrating a representation of an example of the configuration of a system 4 in accordance with an embodiment is described. In FIG. 4, the system 4 may include a host 410 and a semiconductor apparatus 420. The host 410 may be a processor which controls the semiconductor apparatus 420. The host 410 may be electrically coupled with the semiconductor apparatus 420 through at least one signal transmission line 450, and form one link. The at least one signal transmission line 450 may be a signal transmission line pair for transmitting a differential signal, or may include a plurality of signal transmission line pairs for transmitting a plurality of differential signals. The host 410 may include an interface circuit 411 to communicate with the semiconductor apparatus 420 through the at least one signal transmission line 450. The interface circuit 411 may correspond to the interface circuit 210 of the master device shown in FIG. 2. The interface circuit 411 may be a physical layer PHY necessary for signal transmission between the host 410 and the semiconductor apparatus 420.

The semiconductor apparatus 420 may store and output data by being controlled by the host 410. The semiconductor apparatus 420 may be a large capacity storage device such as a solid state drive. The semiconductor apparatus 420 may include a controller 430 and a plurality of nonvolatile memories 441 to 444. The controller 430 may relay the communication between the host 410 and the plurality of nonvolatile memories 441 to 444. The controller 430 may be electrically coupled with the plurality of respective nonvolatile memories 441 to 444. The controller 430 a may form individual sub links or channels with the respective nonvolatile memories 441 to 444. In an embodiment, the controller 430 may form individual sub links or channels with at least two nonvolatile memories. The nonvolatile memories 441 to 444 may be the same kind of memories, or may include different kinds of memories. For example, each of the nonvolatile memories 441 to 444 may include a flash memory, a PRAM (phase change RAM), an MRAM (magnetic RAM), an RRAM (resistive RAM) and an FRAM (ferroelectric RAM).

The controller 430 may include an interface circuit 431 to communicate with the host 410 through the at least one signal transmission line 450. The interface circuit 431 may correspond to the interface circuit 220 of the slave device shown in FIG. 2. The interface circuit 431 may be a physical layer PHY necessary for signal transmission between the host 410 and the semiconductor apparatus 420. The interface circuit 431 may convert an operation mode of the semiconductor apparatus 420 based on the signal transmitted through the at least one signal transmission line 450.

The controller 430 may further include an oscillator 432, a phase-locked loop (PLL) 433, and a clock data recovery circuit (CDR) 434. The oscillator 432 may generate a system clock signal CFGCLK with a predetermined cycle, regardless of an operation mode of the semiconductor apparatus 420. The oscillator 432 may generate the system clock signal CFGCLK not only in the state in which the semiconductor apparatus 420 is activated but also in an operation mode in which the semiconductor apparatus 420 consumes minimal power. The operation mode in which the semiconductor apparatus 420 consumes minimal power may be a stall mode. Further, the stall mode may be, for example, a slip mode, a power-down mode, a deep power-down mode or a standby mode.

The phase-locked loop 433 may generate a data clock signal DCLK. The data clock signal DCLK may have a shorter cycle and/or a higher frequency when compared to the system clock signal CFGCLK. An amount of current needed for the phase-locked loop 433 to generate the data clock signal DCLK may be substantially large. Therefore, the phase-locked loop 433 may generate the data clock signal DCLK when the semiconductor apparatus 420 is activated. For example, the semiconductor apparatus 420 may be activated in a burst operation mode, and the phase-locked loop 433 may generate the data clock signal DCLK in the burst operation mode.

The clock data recovery circuit 434 may change the phase of the data clock signal DCLK. The clock data recovery circuit 434 may change the phase of the data clock signal DCLK based on the signal transmitted through the at least one signal transmission line 450 such that the phase of the data clock signal DCLK corresponds to the phase of the signal transmitted through the at least one signal transmission line 450. The oscillator 432 and the clock data recovery circuit 434 may be circuits of an analog operation region, like the phase-locked loop 433.

Figure 5:
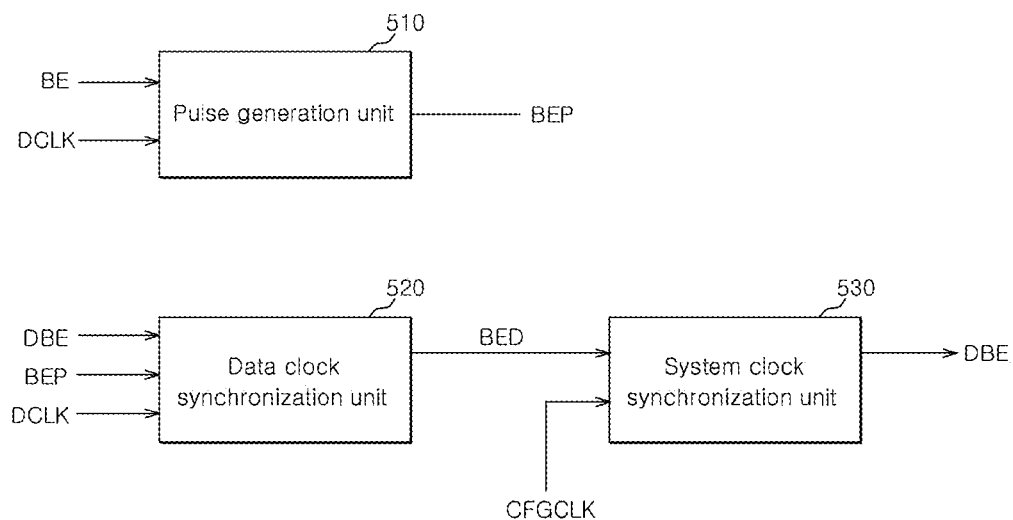
FIG. 5 is a diagram illustrating a representation of an example of the configuration of an interface circuit in accordance with an embodiment.

Referring to FIG. 5, a diagram illustrating a representation of an example of the configuration of an interface circuit 5 in accordance with an embodiment. The interface circuit 5 may be applied as the interface circuit 431 shown in FIG. 4. In FIG. 5, the interface circuit 5 may include a pulse generation unit 510, a data clock synchronization unit 520, and a system clock synchronization unit 530. The pulse generation unit 510 may generate a burst end pulse BEP based on a burst end signal BE and a data clock signal DCLK. The pulse generation unit 510 may generate the burst end pulse BEP by synchronizing the burst end signal BE with the data clock signal DCLK. For example, the pulse generation unit 510 may generate the burst end pulse BEP which has a pulse width corresponding to 1 cycle of the data clock signal DCLK, when the level of the burst end signal BE transitions. The burst end signal BE may be enabled to a high level when a burst operation is performed. The burst end signal BE may be disabled to a low level when the burst operation is ended. The burst operation may be an active operation mode of a semiconductor apparatus including the interface circuit 5. If the burst operation is ended, the semiconductor apparatus may end the active operation mode, and may enter a stall mode.

The data clock synchronization unit 520 may generate a data clock synchronization signal BED based on the burst end pulse BEP, the data clock signal DCLK and a burst end detection signal DBE. The data clock synchronization unit 520 may enable the data clock synchronization signal BED when the burst end pulse BEP is generated. Further, the data clock synchronization unit 520 may disable the data clock synchronization signal BED when the burst end detection signal DBE is enabled. The data clock synchronization unit 520 may retain the enabled state of the data clock synchronization signal BED from when the burst end pulse BEP is generated to until the burst end detection signal DBE is enabled. The data clock synchronization unit 520 may operate in synchronization with the data clock signal DCLK. For example, the data clock synchronization unit 520 may enable the data clock synchronization signal BED in synchronization with the data clock signal DCLK when the burst end pulse BEP is generated. In addition, the data clock synchronization unit 520 may disable the data clock synchronization signal BED in synchronization with the data clock signal DCLK when the burst end detection signal DBE is enabled.

The system clock synchronization unit 530 may generate the burst end detection signal DBE based on the data clock synchronization signal BED and a system clock signal CFGCLK. The system clock synchronization unit 530 may generate the burst end detection signal DBE from the data clock synchronization signal BED in synchronization with the system clock signal CFGCLK. For example, the system clock synchronization unit 530 may enable the burst end detection signal DBE in synchronization with the system clock signal CFGCLK when the data clock synchronization signal BED is enabled. The system clock synchronization unit 530 may disable the burst end detection signal DBE in synchronization with the system clock signal CFGCLK when the data clock synchronization signal BED is disabled.

Figure 6:
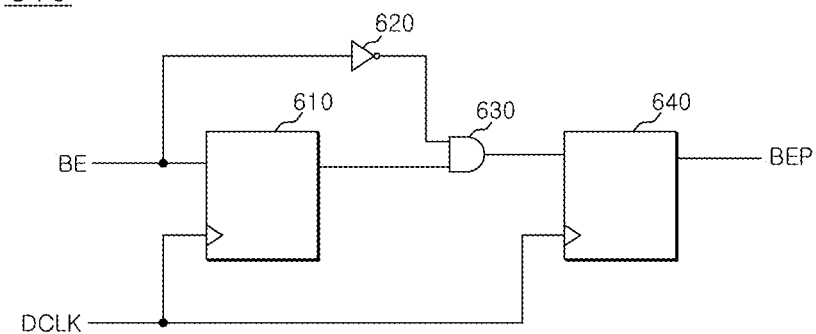
FIG. 6 is a diagram illustrating a representation of an example of the configuration of the pulse generation unit shown in FIG. 5.

Referring to FIG. 6, a diagram illustrating a representation of an example of the configuration of the pulse generation unit 510 shown in FIG. 5 is described. In FIG. 6, the pulse generation unit 510 may include a first flip-flop 610, an inverter 620, an AND gate 630, and a second flip-flop 640. The first flip-flop 610 may receive the burst end signal BE and the data clock signal DCLK. The inverter 620 may invert the burst end signal BE. The AND gate 630 may receive the output of the inverter 620 and the output of the first flip-flop 610. The second flip-flop 640 may receive the output of the AND gate 630 and the data clock signal DCLK. The second flip-flop 640 may also generate the burst end pulse BEP. The first and second flip-flops 610 and 640 may be D flip-flops. The first flip-flop 610, the inverter 620 and the AND gate 630 may generate a pulse which is enabled to a high level when the burst end signal BE transitions from the high level to the low level. The second flip-flop 640 may provide the burst end pulse BEP by synchronizing the enabled pulse with the data clock signal DCLK.

Figure 7:
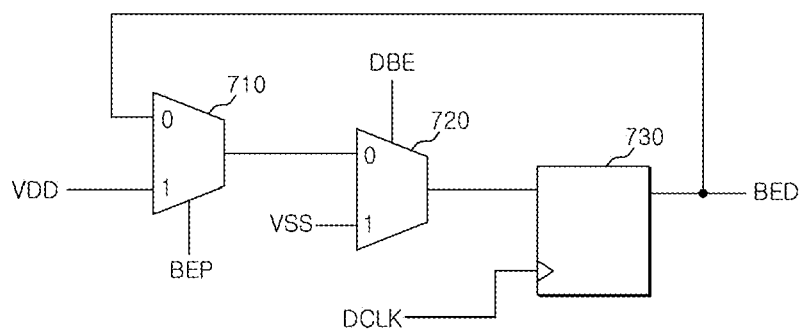
FIG. 7 is a diagram illustrating a representation of an example of the configuration of the data clock synchronization unit shown in FIG. 5.

Referring to FIG. 7, a diagram illustrating a representation of an example of the configuration of the data clock synchronization unit 520 shown in FIG. 5 is described. In FIG. 7, the data clock synchronization unit 520 may include a first multiplexer 710, a second multiplexer 720, and a flip-flop 730. The first multiplexer 720 may output one of the data clock synchronization signal BED and an external voltage VDD in response to the burst end pulse BEP. For example, the first multiplexer 710 may output the external voltage VDD when the burst end pulse BEP is enabled. The first multiplexer 710 may also output the data clock synchronization signal BED when the burst end pulse BEP is disabled. The second multiplexer 720 may output one of the output of the first multiplexer 710 and a ground voltage VSS in response to the burst end detection signal DBE. For example, the second multiplexer 720 may output the output of the first multiplexer 710 when the burst end detection signal DBE is disabled. The second multiplexer 720 may also output the ground voltage VSS when the burst end detection signal DBE is enabled. The flip-flop 730 may output the data clock synchronization signal BED by synchronizing the output of the second multiplexer 720 with the data clock signal DCLK. The first multiplexer 710 may output the external voltage VDD when the burst end pulse BEP is generated. The second multiplexer 720 may output the output of the first multiplexer 710 in response to the burst end detection signal DBE which is disabled. Further, the flip-flop 730 may enable the data clock synchronization signal BED in synchronization with the data clock signal DCLK. Since the first multiplexer 710 outputs the enabled data clock synchronization signal BED even after the burst end pulse BEP is disabled, the enabled state of the data clock synchronization signal BED may be retained. Thereafter, if the burst end detection signal DBE is enabled, the second multiplexer 720 may output the ground voltage VSS instead of the output of the first multiplexer 710. Accordingly, the flip-flop 730 may disable the data clock synchronization signal BED in synchronization with the data clock signal DCLK.

Figure 8:
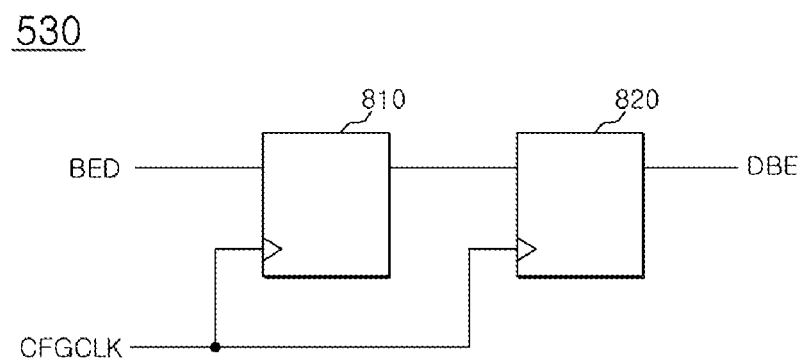
FIG. 8 is a diagram illustrating a representation of an example of the configuration of the system clock synchronization unit shown in FIG. 5.

Referring to FIG. 8, a diagram illustrating a representation of an example of the configuration of the system clock synchronization unit 530 shown in FIG. 5 is described. In FIG. 8, the system clock synchronization unit 530 may include first and second flip-flops 810 and 820. The first flip-flop 810 may receive the data clock synchronization signal BED and the system clock signal CFGCLK. The second flip-flop 820 may receive the output of the first flip-flop 810 and the system clock signal CFGCLK. The second flip-flop 820 may also output the burst end detection signal DBE. The first flip-flop 810 may enable an output signal in synchronization with the system clock signal CFGCLK when the data clock synchronization signal BED is enabled. Further, the second flip-flop 820 may enable the burst end detection signal DBE in synchronization with the system clock signal CFGCLK when the output signal of the first flip-flop 810 is enabled. While it is illustrated as an example that the number of flip-flops which configure the system clock synchronization unit 530 is 2, it is to be noted that the embodiment is not limited to such an example and the circuit may be configured by various numbers of flip-flops. The data clock synchronization unit 520 which operates in synchronization with the data clock signal DCLK may retain the enabled state of the data clock synchronization signal BED until the system clock synchronization unit 530 which operates in synchronization with the system clock signal CFGCLK generates the burst end detection signal DBE.

Referring to FIG. 9, a representation of an example of a waveform diagram to assist in the explanation of operations of interface circuits according to an embodiment is described. Operations of the semiconductor apparatus 420 and the interface circuit 5 in accordance with the embodiments will be described below with reference to FIGS. 4 to 9. The semiconductor apparatus 420 may transition the level of the burst end signal BE from the high level to the low level when data of a specific pattern is received from the host 410. The semiconductor apparatus 420 should detect the level transition of the burst end signal BE when the system clock signal CFGCLK has a high level. However, as shown in FIG. 9, where the phase of the system clock signal CFGCLK is a low level when the level of the burst end signal BE transitions, the semiconductor apparatus 420 may not recognize that the burst operation is ended, and may not enter the stall mode.

The interface circuit 5 in accordance with an embodiment enables the data clock synchronization signal BED when the level of the burst end signal BE transitions, and thereby allows the semiconductor apparatus 420 to recognize that the burst operation is ended, by the system clock signal CFGCLK. If the level of the burst end signal BE transitions, the pulse generation unit 510 may generate the burst end pulse BEP in synchronization with the data clock signal DCLK. If the burst end pulse BEP is enabled, the data clock synchronization unit 520 may enable the data clock synchronization signal BED. If the burst end pulse BEP is enabled, the first multiplexer 710 outputs the external voltage VDD. Further, the second multiplexer 720 outputs the output of the first multiplexer 710. The flip-flop 730 may receive the output of the second multiplexer 720, and may enable the data clock synchronization signal BED. Even though the burst end pulse BEP is disabled, the data clock synchronization signal BED may retain the enabled state until the burst end detection signal DBE is enabled. The system clock synchronization unit 530 may enable the burst end detection signal DBE in synchronization with the system clock signal CFGCLK. The first and second flip-flops 810 and 820 may enable the burst end detection signal DBE in synchronization with the system clock signal CFGCLK. If the burst end detection signal DBE is enabled, the second multiplexer 720 may output the ground voltage VSS and disable the data clock synchronization signal BED.

While various embodiments have been described above, it will be understood to those skilled in the art that the embodiments described are examples only. Accordingly, the interface circuit for high speed communication, and the semiconductor apparatus and the system including the same described herein should not be limited based on the described embodiments above.

What is claimed is:

1. A semiconductor apparatus including an interface circuit comprising:
    a pulse generation unit configured to generate a burst end pulse from a burst end signal according to a data clock signal;
    a data clock synchronization unit configured to enable a data clock synchronization signal based on the burst end pulse and the data clock signal, and disable the data clock synchronization signal according to a burst end detection signal; and
    a system clock synchronization unit configured to generate the burst end detection signal by synchronizing the data clock synchronization signal with a system clock signal.

2. The semiconductor apparatus according to claim 1, wherein the data clock signal has a frequency higher than the system clock signal.

3. The semiconductor apparatus according to claim 1, wherein the burst end signal is a signal which transitions from one digital level to another digital level when the semiconductor apparatus receives data of a specific pattern.

4. The semiconductor apparatus according to claim 1, wherein the pulse generation unit generates the burst end pulse which is synchronized with the data clock signal and has a pulse width corresponding to one cycle of the data clock signal, when a level of the burst end signal transitions.

5. The semiconductor apparatus according to claim 1, wherein the data clock synchronization unit enables the data clock synchronization signal when the burst end pulse is generated, and disables the data clock synchronization signal when the burst end detection signal is enabled.

6. A semiconductor apparatus including an interface circuit comprising:
    a pulse generation unit configured to generate a burst end pulse according to a burst end signal and a data clock signal;
    a data clock synchronization unit configured to enable a data clock synchronization signal until a burst end detection signal is enabled when the burst end pulse is generated; and
    a system clock synchronization unit configured to generate the burst end detection signal by synchronizing the data clock synchronization signal with a system clock signal.

7. The semiconductor apparatus according to claim 6, wherein the data clock signal has a frequency higher than the system clock signal.

8. The semiconductor apparatus according to claim 6, wherein the burst end signal is a signal which transitions from one digital level to another digital level when the semiconductor apparatus receives data of a specific pattern.

9. The semiconductor apparatus according to claim 6, wherein the pulse generation unit generates the burst end pulse synchronized with the data clock signal and has a pulse width corresponding to one cycle of the data clock signal, when a level of the burst end signal transitions.

10. The semiconductor apparatus according to claim 6, wherein the data clock synchronization unit enables the data clock synchronization signal when the burst end pulse is generated, and disables the data clock synchronization signal when the burst end detection signal is enabled.

11. A system comprising:
    a semiconductor apparatus electrically coupled with a host, and including a controller and at least one memory electrically coupled with the controller and stores and outputs data,
    the controller comprising:
    a pulse generation unit configured to generate a burst end pulse according to a burst end signal and a data clock signal;
    a data clock synchronization unit configured to enable a data clock synchronization signal until a burst end detection signal is enabled when the burst end pulse is generated; and
    a system clock synchronization unit configured to generate the burst end detection signal by synchronizing the data clock synchronization signal with a system clock signal.

12. The system according to claim 11, wherein the data clock signal has a frequency higher than the system clock signal.

13. The system according to claim 11, wherein the controller generates the burst end signal when data of a specific pattern is received from the host.

14. The system according to claim 11, wherein the pulse generation unit generates the burst end pulse synchronized with the data clock signal and has a pulse width corresponding to one cycle of the data clock signal when a level of the burst end signal transitions.

15. The system according to claim 11, wherein the data clock synchronization unit enables the data clock synchronization signal when the burst end pulse is generated, and disables the data clock synchronization signal when the burst end detection signal is enabled.

16. The system according to claim 11, wherein the system clock synchronization unit is configured to enable the burst end detection signal when the data clock synchronization signal is enabled and disable the burst end detection signal when the data clock synchronization signal is disabled.

17. The system according to claim 11, wherein the data clock synchronization unit is configured to retain an enabled state of the data clock synchronization signal from when the burst end pulse is generated until the burst end detection signal is enabled.

18. The system according to claim 11, wherein the burst end signal is enabled to a high level during a burst operation, and disabled to a low level when the burst operation has ended.

19. The system according to claim 11, further comprising:
    an oscillator is configured to generate the system clock signal with a predetermined cycle.

20. The system according to claim 11, further comprising:
    a phase-locked loop configured to generate the data clock signal to have a shorter cycle in comparison to the system clock signal.

* * * * *